United States Patent
Chung

(10) Patent No.: US 11,616,257 B2
(45) Date of Patent: Mar. 28, 2023

(54) BATTERY MANAGEMENT DEVICE

(71) Applicant: LG CHEM, LTD., Seoul (KR)

(72) Inventor: Moon-Koo Chung, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 242 days.

(21) Appl. No.: 17/251,934

(22) PCT Filed: Oct. 18, 2019

(86) PCT No.: PCT/KR2019/013750
§ 371 (c)(1),
(2) Date: Dec. 14, 2020

(87) PCT Pub. No.: WO2020/080881
PCT Pub. Date: Apr. 23, 2020

(65) Prior Publication Data
US 2021/0265671 A1    Aug. 26, 2021

(30) Foreign Application Priority Data
Oct. 19, 2018   (KR) ................ 10-2018-0125539

(51) Int. Cl.
*H01M 10/42*    (2006.01)
*G01R 31/382*    (2019.01)
*H02J 7/00*    (2006.01)

(52) U.S. Cl.
CPC ........ *H01M 10/425* (2013.01); *G01R 31/382* (2019.01); *H02J 7/0048* (2020.01); *H01M 2010/4271* (2013.01); *H01M 2220/20* (2013.01)

(58) Field of Classification Search
None
See application file for complete search history.

(56) References Cited

U.S. PATENT DOCUMENTS

| 2006/0043934 A1 | 3/2006 | Sugimoto |
| 2013/0017419 A1 | 1/2013 | Jin |
| 2013/0088202 A1* | 4/2013 | Kamata ................ H02J 7/0016 320/126 |

(Continued)

FOREIGN PATENT DOCUMENTS

| JP | 2006-73364 A | 3/2006 |
| JP | 3975801 B2 | 9/2007 |

(Continued)

OTHER PUBLICATIONS

Extended European Search Report for Application No. 19873770.2 dated Sep. 3, 2021.

(Continued)

*Primary Examiner* — Roy Y Yi
(74) *Attorney, Agent, or Firm* — Birch, Stewart, Kolasch & Birch, LLP

(57) ABSTRACT

The present disclosure relates to a battery management device for balancing state of charges (SOCs) of a plurality of battery cells while maintaining a substrate temperature of a substrate to which a balancing resistor of each of a plurality of battery cells is mounted to a reference temperature or below. Since the substrate temperature is maintained at the reference temperature or below by controlling the duty cycle of a balancing switch, it is possible to prevent components included in the battery management device from being overheated and damaged due to the heat generated during the balancing process.

13 Claims, 4 Drawing Sheets

(56) References Cited

U.S. PATENT DOCUMENTS

| | | |
|---|---|---|
| 2014/0042977 A1 | 2/2014 | Kim |
| 2014/0055896 A1* | 2/2014 | Muramoto ......... G01R 31/3835 |
| | | 361/86 |
| 2014/0210415 A1 | 7/2014 | Ohmori |
| 2015/0008886 A1 | 1/2015 | Kim |
| 2018/0145520 A1 | 5/2018 | Sasaki et al. |
| 2018/0151919 A1 | 5/2018 | Sasaki et al. |
| 2018/0316207 A1 | 11/2018 | Irish et al. |
| 2019/0052098 A1 | 2/2019 | Hong et al. |
| 2019/0097434 A1 | 3/2019 | Kim |

FOREIGN PATENT DOCUMENTS

| | | |
|---|---|---|
| JP | 2011-155752 A | 8/2011 |
| JP | 2012-115101 A | 6/2012 |
| JP | 2014-171323 A | 9/2014 |
| JP | 6194841 B2 | 9/2017 |
| JP | WO2016/190292 A1 | 3/2018 |
| KR | 10-0468127 B1 | 1/2005 |
| KR | 10-2012-0020504 A | 3/2012 |
| KR | 10-2015-0004035 A | 1/2015 |
| KR | 10-2018-0013495 A | 2/2018 |
| KR | 10-2018-0036237 A | 4/2018 |
| KR | 10-2018-0082345 A | 7/2018 |
| WO | WO 2016/190293 A1 | 1/2016 |
| WO | WO 2018/074807 A1 | 4/2018 |

OTHER PUBLICATIONS

International Search Report for PCT/KR2019/013750 dated Jan. 29, 2020.

* cited by examiner

BATTERY MANAGEMENT DEVICE

TECHNICAL FIELD

The present application claims priority to Korean Patent Application No. 10-2018-0125539 filed on Oct. 19, 2018 in the Republic of Korea, the disclosures of which are incorporated herein by reference.

The present disclosure relates to a battery management device, and more particularly, to a battery management device for balancing SOCs of a plurality of battery cells while maintaining a substrate temperature of a substrate to which a balancing resistor of each of a plurality of battery cells is mounted to a reference temperature or below.

BACKGROUND ART

Recently, due to the depletion of fossil energy and environmental pollution, there is a growing interest in electrical products that may be driven using electrical energy without using fossil energy.

Accordingly, the development and demand for technology of mobile devices, electric vehicles, hybrid electric vehicles, power storage devices and uninterruptible power supplies increase. For this reason, the demand for secondary batteries as energy sources is rapidly increasing, and the types of demand are also diversifying. Thus, many researches on secondary batteries have been conducted to meet various demands.

In general, the secondary batteries include nickel cadmium batteries, nickel hydrogen batteries, lithium ion batteries, and lithium ion polymer batteries. The secondary batteries are classified into lithium-based batteries and nickel hydrogen-based batteries. The lithium-based batteries are mainly applied to small products such as digital cameras, P-DVDs, MP3Ps, mobile phones, PDAs, portable game devices, power tools, and e-bikes. Also, the nickel hydrogen-based batteries are applied to large products demanding a high output such as electric vehicles and hybrid electric vehicles.

Meanwhile, in order to drive an electric vehicle or a hybrid electric vehicle, an electric motor requiring a high power must be operated. In addition, a power storage device that powers a building or certain area must provide enough power to meet the demanded power. In order to provide high output or large capacity power, a plurality of batteries, each having unit cell assemblies, are connected in series or in parallel, thereby supplying a desired output or power.

However, if a battery in which a plurality of unit cells are connected is repeatedly charged and discharged, a difference occurs in SOC (State Of Charge) of the unit cells. If the battery continues to be discharged in a state where the SOC is not balanced, a specific unit cell with a low SOC is overdischarged, and thus the battery may not easily operate stably. On the contrary, if the battery continues to be charged in a state where the SOC is not balanced, a specific unit cell having a high SOC is overcharged, thereby degrading the safety of the battery. The imbalance of SOC may cause some unit cells to be overcharged or overdischarged, and due to this problem, it is impossible to stably supply a power to a load (for example, an electric motor or a power grid).

In order to solve the above problem, various types of circuits are used to continuously monitor SOCs of battery cells and balance the SOCs of the battery cells to a certain level.

In particular, a passive balancing circuit that connects a specific cell with a higher SOC than other unit cells to a balancing resistor to discharge the cell has the advantage of rapid balancing. However, during the balancing process, heat is generated from the balancing resistor, thereby causing the substrate to which the balancing resistor is mounted to overheat. As a result, devices such as an IC, a memory and a switch mounted to the substrate may also be overheated and damaged.

Therefore, there is a need for a balancing technique capable of balancing SOCs of a plurality of battery cells without overheating the substrate to which the balancing resistor is mounted.

DISCLOSURE

Technical Problem

The present disclosure is directed to providing a battery management device, which may maintain a substrate temperature of a substrate to which a balancing resistor of a balancing target battery cell is mounted to a reference temperature or below by controlling a duty cycle of a balancing switch that electrically connects the balancing target battery cell and the balancing resistor.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management device according to an aspect of the present disclosure comprises: a balancing circuit unit including a substrate, a plurality of balancing resistors mounted to the substrate, the plurality of balancing resistors being configured to be electrically connected to a plurality of battery cells, respectively, a plurality of balancing paths configured to electrically connect the plurality of battery cells to the plurality of balancing resistors, respectively, and a plurality of balancing switches for electrically connecting or disconnecting the plurality of balancing paths; and a processor configured to determine a balancing target battery cell among the plurality of battery cells on the basis of a state of charge (state of charge) of each of the plurality of battery cells, compare a substrate temperature of the substrate to which a balancing target resistor among the plurality of balancing resistors electrically connected to the balancing target battery cell is mounted with a reference temperature, select a balancing target switch among the plurality of balancing switches for electrically connecting or disconnecting a balancing path that electrically connects the balancing target battery cell to the balancing target resistor on the basis of the comparison result, and control an operation state of the selected balancing target switch to adjust a balancing current flowing through the balancing target resistor electrically connected to the balancing target battery cell, so that the substrate temperature is maintained equal to or lower than the reference temperature.

Preferably, when the balancing target battery cell is determined, the processor may compare the substrate temperature with the reference temperature, and when the comparison result shows that the substrate temperature is lower than the reference temperature, the processor may control the operation state of the balancing target switch such that the balancing current is maximized.

Preferably, the processor may control the operation state of the balancing target switch such that a duty cycle of the balancing target switch is maximized.

Preferably, when the balancing target battery cell is determined, the processor may compare the substrate temperature with the reference temperature, and when the comparison result shows that the substrate temperature is identical to the reference temperature, the processor may control the operation state of the balancing target switch such that a power consumption of the balancing target resistor electrically connected to the balancing target battery cell is equal to a heat transfer amount transferred from the substrate to the outside.

Preferably, the processor may calculate a duty cycle of the balancing target switch at which the power consumption is equal to the heat transfer amount and control the operation state of the balancing target switch to the calculated duty cycle.

Preferably, when the balancing target battery cell is determined, the processor may compare the substrate temperature with the reference temperature, and when the comparison result shows that the substrate temperature is greater than the reference temperature, the processor may control the operation state of the balancing target switch such that a power consumption of the balancing target resistor electrically connected to the balancing target battery cell is lower than a heat transfer amount transferred from the substrate to the outside.

Preferably, the processor may calculate a duty cycle of the balancing target switch at which the power consumption is lower than the heat transfer amount and control the operation state of the balancing target switch to the calculated duty cycle.

Preferably, the processor may calculate a duty cycle of the balancing target switch such that the substrate temperature is lower than the reference temperature within a reference time, and control the operation state of the balancing target switch to the calculated duty cycle.

A battery pack according to another aspect of the present disclosure may comprise the battery management device.

A vehicle according to still another aspect of the present disclosure may comprise the battery management device.

Advantageous Effects

According to the present disclosure, since a substrate temperature of a substrate to which a balancing resistor of a balancing target battery cell is mounted is maintained to a reference temperature or below by controlling a duty cycle of a balancing switch that electrically connects the balancing target battery cell and the balancing resistor, it is possible to prevent components included in the battery management device from being overheated and damaged due to the heat generated during the balancing process.

BEST MODE

Figure 1:
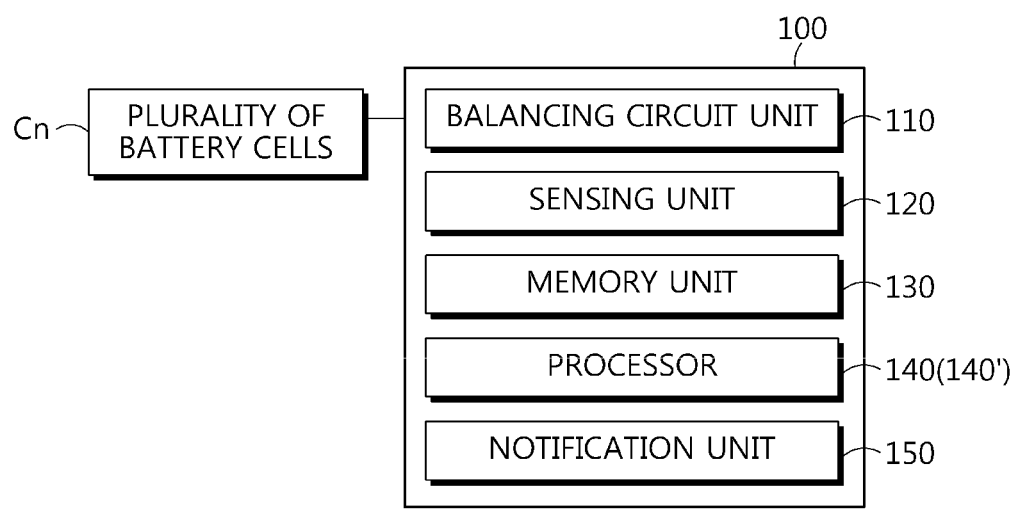
FIG. 1 is a block diagram schematically showing a battery management device according to an embodiment of the present disclosure and a battery pack including the same.

The above objects, features and advantages will be described in detail with reference to the accompanying drawings, whereby those skilled in the art may easily implement the technical idea of the present disclosure. In the present disclosure, detailed descriptions of known technologies related to the present disclosure will be omitted if it is determined that they may unnecessarily obscure the subject matter of the present disclosure. Hereinafter, preferred embodiments of the present disclosure will be described in detail with reference to the accompanying drawings. In the drawings, the same reference signs are used to indicate the same or similar components.

Figure 2:
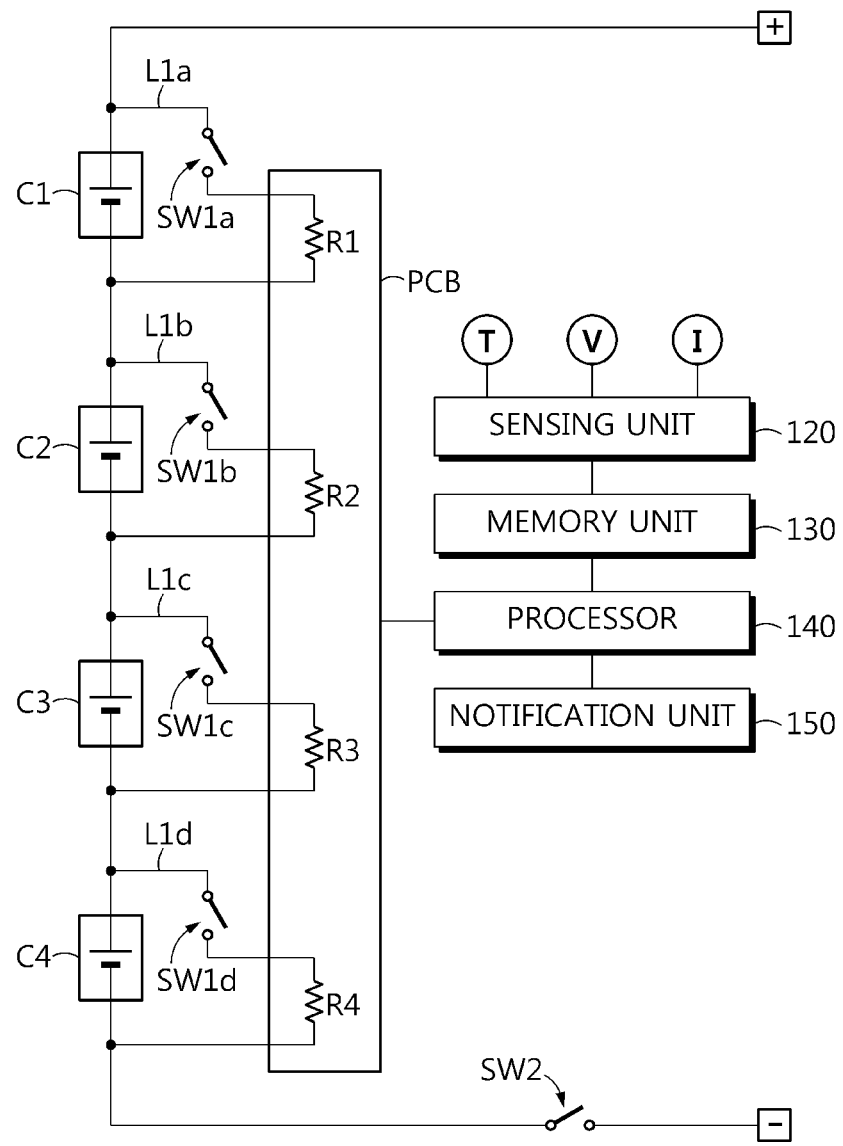
FIG. 2 is a circuit diagram schematically showing a connection configuration of the battery management device according to an embodiment of the present disclosure and the battery pack including the same.
Figure 3:
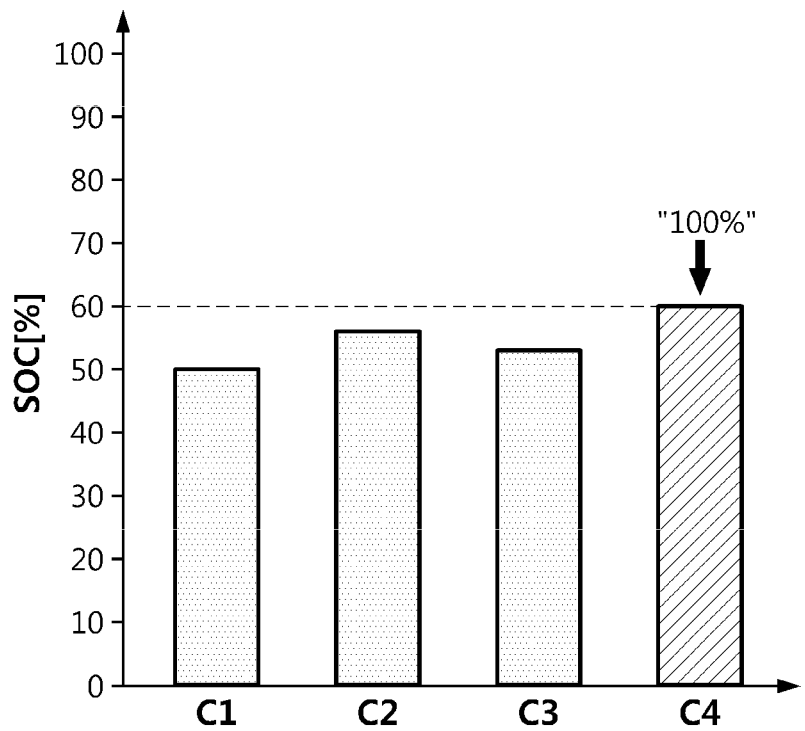
FIG. 3 is a graph showing SOCs of a plurality of battery cells before the battery management device according to an embodiment of the present disclosure performs balancing.
Figure 4:
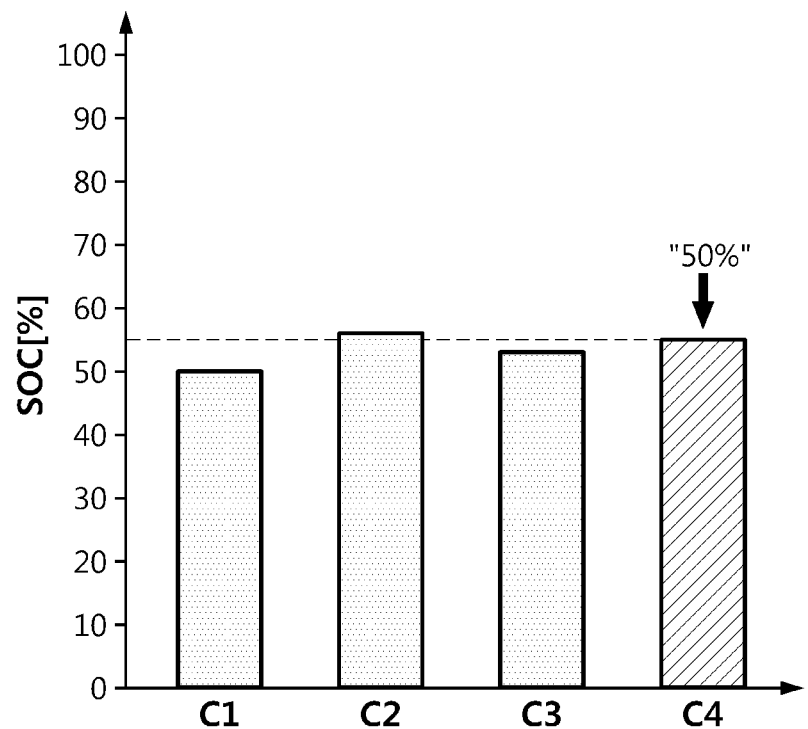
FIG. 4 is a graph showing SOCs of the plurality of battery cells while the battery management device according to an embodiment of the present disclosure performs balancing.

FIG. 1 is a block diagram schematically showing a battery management device 100 according to an embodiment of the present disclosure and a battery pack including the same. FIG. 2 is a circuit diagram schematically showing a connection configuration of the battery management device 100 according to an embodiment of the present disclosure and the battery pack including the same. FIG. 3 is a graph showing SOCs of a plurality of battery cells C1 to C4 before the battery management device 100 according to an embodiment of the present disclosure performs balancing. FIG. 4 is a graph showing SOCs of the plurality of battery cells C1 to C4 while the battery management device 100 according to an embodiment of the present disclosure performs balancing.

Referring to FIGS. 1 to 4, the battery management device 100 according to an embodiment of the present disclosure may be included in a battery pack having a plurality of battery cells C1 to C4 to perform balancing between the plurality of battery cells C1 to C4. For example, the battery management device 100 may perform balancing on the basis of SOC (State Of Charge) of the plurality of battery cells C1 to C4.

The plurality of battery cells C1 to C4 may be charged or discharged according to an operation state of a charging and discharging switch SW2 included in the battery pack. For example, if the charging and discharging switch SW2 is in a turn-on state, the plurality of battery cells C1 to C4 may be charged by receiving a charging current from a load connected to the battery pack or may be discharged by outputting a discharging current to an external load. In addition, if the charging and discharging switch SW2 is in a turn-off state, the plurality of battery cells C1 to C4 may be disconnected from the load connected to the battery pack.

Here, the SOC (State Of Charge) may be a ratio of a present charged capacity to a maximum charged capacity of each of the plurality of battery cells C1 to C4. In addition, the balancing may refer to a process of discharging a battery cell, which is determined as a balancing target battery cell among the plurality of battery cells C1 to C4, so that SOCs are equal to each other, if the SOCs are changed while the plurality of battery cells C1 to C4 are charged and discharged.

To this end, the battery management device 100 according to an embodiment of the present disclosure may include a balancing circuit unit 110, a sensing unit 120, a memory unit 130, a processor 140, and a notification unit 150.

The balancing circuit unit 110 may include a plurality of balancing resistors R1 to R4, a plurality of balancing paths L1a to L1d, and a plurality of balancing switches SW1a to SW1d.

The plurality of balancing resistors R1 to R4 may be electrically connected to a corresponding battery cells among the plurality of battery cells C1 to C4 through the plurality of balancing paths L1a to L1d.

That is, the plurality of balancing resistors R1 to R4 may be connected in series with a corresponding battery cell among the plurality of battery cells C1 to C4 through the plurality of balancing paths L1a to L1d.

The plurality of balancing resistors R1 to R4 may be mounted together to a substrate PCB on which components of the battery management device described above are mounted. Accordingly, if a discharging current of each of the plurality of battery cells C1 to C4 is output to the plurality of balancing resistors R1 to R4, a resistance heat generated from the plurality of balancing resistors R1 to R4 may be conducted to the substrate PCB. Thus, not only the substrate PCB but also the components of the battery management device mounted on the substrate PCB may be overheated.

In an embodiment, the plurality of balancing resistors R1 to R4 may be mounted to one substrate PCB as shown in FIG. 2.

Referring to FIG. 2, the first balancing path L1a may include a first battery cell C1, a first balancing switch SW1a, and a first balancing resistor R1. The second balancing path L1b may include a second battery cell C2, a second balancing switch SW1b, and a second balancing resistor R2. The third balancing path L1c may include a third battery cell C3, a third balancing switch SW1c and a third balancing resistor R3. The fourth balancing path L1d may include a fourth battery cell C4, a fourth balancing switch SW1d and a fourth balancing resistor R4.

Each of the plurality of balancing switches SW1a to SW1d may be provided to a corresponding balancing path among the plurality of balancing paths L1a to L1d to electrically connect or disconnect the plurality of balancing resistors R1 to R4 and the plurality of battery cells C1 to C4, respectively.

The operation states of the plurality of balancing switches SW1a to SW1d may be controlled to a turn-on state or a turn-off state in response to a control signal output from the processor 140.

If the operating state of the plurality of balancing switches SW1a to SW1d is controlled to the turn-on state, the discharging current of the plurality of battery cells C1 to C4 may be output to the plurality of balancing resistors R1 to R4, respectively.

Conversely, if the operation state of the plurality of balancing switches SW1a to SW1d is controlled to the turn-off state, the plurality of balancing resistors R1 to R4 and the plurality of battery cells C1 to C4 may be electrically disconnected, respectively.

The sensing unit 120 may be operably coupled with the processor 140. That is, the sensing unit 120 may be connected to the processor 140 to transmit an electrical signal to the processor 140 or receive an electrical signal from the processor 140.

The sensing unit 120 may repeatedly measure a cell voltage by measuring voltages at both ends of the plurality of battery cells C1 to C4 at every preset cycle.

The sensing unit 120 may repeatedly measure a cell current input or output to each of the plurality of battery cells C1 to C4 at every preset cycle.

The sensing unit 120 may repeatedly measure a substrate temperature of the substrate PCB to which the plurality of balancing resistors R1 to R4 are mounted and an internal temperature of the battery pack at every preset cycle.

The sensing unit 120 may provide a measurement signal indicating the measured cell voltage, the measured cell current, the measured substrate temperature and the measured internal temperature to the processor 140.

To this end, the sensing unit 120 may include a voltage sensor configured to measure the cell voltage, a current sensor configured to measure the cell current, and a temperature sensor configured to measure the substrate temperature and the internal temperature.

If the measurement signal is received from the sensing unit 120, the processor 140 may determine digital values of the cell voltage, the cell current, the substrate temperature and the internal temperature through signal processing and store the digital values in the memory unit 130.

The memory unit 130 is a semiconductor memory device and may write, erase and update data generated by the processor 140. In addition, the memory unit 130 may store a plurality of program codes that may be executed by the processor 140. For example, the plurality of program codes may include a code for estimating the SOCs of the plurality of battery cells C1 to C4, a code for determining a balancing target battery cell, and a code for controlling the plurality of balancing switches SW1a to SW1d corresponding to the substrate temperature. In addition, the memory unit 130 may store preset values of various predetermined parameters used in implementing the present disclosure.

The memory unit 130 is not particularly limited as long as it is a semiconductor memory device known to be capable of writing, erasing and updating data. For example, the memory unit 130 may be a DRAM, an SDRAM, a flash memory, a ROM, an EEPROM, a register, or the like. The memory unit 130 may further include a storage medium that stores program codes defining control logics of the processor 140. The storage medium includes a non-volatile memory element such as a flash memory or a hard disk. The memory unit 130 may be physically separated from the processor 140 or may be integrated with the processor 140.

First, the processor 140 may estimate SOCs of the plurality of battery cells C1 to C4 on the basis of the cell current input and output to each of the plurality of battery cells C1 to C4.

The processor 140 may estimate the SOC of each of the plurality of battery cells C1 to C4 by using a current integration method that integrates the cell current of each of the plurality of battery cells C1 to C4.

Even though the processor 140 is described as estimating the SOC of each of the plurality of battery cells C1 to C4 using a current integration method, the estimating method is not limited thereto as long as the SOC of each of the plurality of battery cells C1 to C4 can be estimated.

The processor 140 may determine a balancing target battery cell among the plurality of battery cells C1 to C4 on the basis of the SOC of each of the plurality of battery cells C1 to C4.

More specifically, the processor 140 may calculate a SOC difference of the plurality of battery cells C1 to C4 and determine whether the calculated SOC difference is greater than or equal to a preset reference difference value.

In this case, the processor 140 may calculate a difference between the smallest SOC and another SOC among the SOCs of the plurality of battery cells C1 to C4 as the SOC difference.

As shown in FIG. 3, if the SOCs of the plurality of battery cells "C1", "C2", "C3" and "C4" are "50%", "56%", "53%" and "60%", respectively, the processor 140 may calculate SOC difference between the SOC "50%" of the first battery cell "C1", which is the smallest SOC, and the SOCs "56%", "53%" and "60%" of the remaining battery cells "C2", "C3" and "C4", respectively. Accordingly, the processor 140 may calculate the SOC difference between the SOC of the first battery cell "C1" and the SOCs of the remaining battery cells "C2", "C3" and "C4" as "6%", "3%" and "10%", respectively.

After that, the processor 140 may determine whether the calculated SOC difference is greater than or equal to the preset reference difference value, and if the calculated SOC difference is greater than or equal to the preset reference difference value, the processor 140 may determine a battery cell having the greatest SOC as a balancing target battery cell.

For example, if the preset reference difference value is "5%", the processor 140 may check that the SOC differences of the second battery cell "C2" and the fourth battery cell "C4" are greater than or equal to the preset reference difference value and determine that the fourth battery cell "C4" having the greatest SOC among the second battery cell "C2" and the fourth battery cell "C4" as the balancing target battery cell.

The processor 140 may compare the substrate temperature of the substrate PCB to which the fourth balancing resistor R4 electrically connected to the balancing target battery cell C4 is mounted with the reference temperature. In addition, based on the comparison result, the processor 140 may select the fourth balancing switch SW1*d*, which electrically connects or disconnects the fourth balancing path L1*d*, among the plurality of balancing switches SW1*a* to SW1*d* as the balancing target switch. In addition, the processor 140 may control the operation state of the fourth balancing switch SW1*d* selected as the balancing target switch.

Here, the fourth balancing switch SW1*d* may be a switch for electrically connecting or disconnecting the fourth balancing path L1*d*, which electrically connects the balancing target battery cell C4 and the fourth balancing resistor R4, among the plurality of balancing switches SW1*a* to SW1*d*.

Here, the reference temperature may be a maximum temperature at which electronic components such as a balancing resistor mounted to the substrate PCB are not damaged due to high temperature. That is, if the substrate temperature is higher than the reference temperature, the electronic components mounted to the substrate PCB may be damaged due to the high temperature.

The processor 140 may control the operation state of the fourth balancing switch SW1*d* to maintain the substrate temperature to the reference temperature or below by adjusting the balancing current flowing in the fourth balancing resistor R4 electrically connected to the balancing target battery cell C4.

More specifically, if the balancing target battery cell C4 is determined, the processor 140 may compare the substrate temperature of the substrate PCB to which the fourth balancing resistor R4 electrically connected to the balancing target battery cell C4 is mounted with the reference temperature. In addition, if the comparison result shows that the substrate temperature is lower than the reference temperature, the processor 140 may control the operation state of the fourth balancing switch SW1*d* to maximize the balancing current flowing through the fourth balancing resistor R4.

In this case, if the substrate temperature is lower than the reference temperature, the processor 140 may control the operation state of the fourth balancing switch SW1*d* to maximize a duty cycle of the fourth balancing switch SW1*d*.

For example, as shown in FIG. 3, if the substrate temperature is lower than the reference temperature, the processor 140 may continuously output a turn-on control signal such that the duty cycle of the fourth balancing switch SW1*d* becomes "100%".

According to the present disclosure, if the substrate temperature is lower than the reference temperature at which the mounted components are not damaged due to high temperature, even though the heat generated from the balancing resistor is maximum, balancing may be performed quickly by controlling the duty cycle of the balancing switch to the maximum so that the power of the balancing target battery cell is consumed to the maximum.

The processor 140 may compare the substrate temperature with the reference temperature after controlling the operation state of the fourth balancing switch SW1*d* to maximize the duty cycle of the fourth balancing switch SW1*d* or after determining the balancing target battery cell C4. In addition, if the substrate temperature is equal to the reference temperature, the processor 140 may control the operation state of the fourth balancing switch SW1*d* such that the power consumption of the fourth balancing resistor R4 electrically connected to the balancing target battery cell C4 is equal to the heat transfer amount transferred from the substrate PCB to the outside of the substrate PCB.

To this end, if the substrate temperature is equal to the reference temperature, the processor 140 may calculate a duty cycle of the fourth balancing switch SW1*d* at which the power consumption of the fourth balancing resistor R4 is equal to the heat transfer amount transferred from the substrate PCB to the outside of the substrate PCB.

In this case, the processor 140 may calculate the duty cycle of the fourth balancing switch SW1*d* at which the power consumption of the fourth balancing resistor R4 is equal to the heat transfer amount transferred from the substrate PCB to the outside of the substrate PCB by using Equation 1 below.

$$D = \frac{hAR(T_e - T_p)}{V^2} \quad \langle \text{Equation 1} \rangle$$

Here, D is a duty cycle of the balancing switch at which the power consumption of the balancing resistor is equal to the heat transfer amount transferred from the substrate to the outside of the substrate, h is a convection heat transfer coefficient [W/(m$^2$K)] of the substrate, A is an area of the substrate [m$^2$], R is a resistance of the balancing resistor [Ω], Te is an external temperature of the substrate [° C.] (namely, an internal temperature of the battery pack), Tp is a substrate temperature [° C.], and V is a cell voltage [V] of the balancing target battery cell.

For example, it is assumed that the convection heat transfer coefficient (h) is 0.4 [W/m$^2$K], the area (A) of the substrate is 0.02 [m$^2$], the resistance (R) of the balancing resistor is 20 [Ω], the external temperature (Te) of the substrate is 55 [° C.], the substrate temperature (Tp) is 25 [° C.], and the cell voltage (V) of the battery cell is 3.7 [V]. In this case, seeing Equation 1, the processor 140 may calculate the duty cycle of the balancing switch as "35%".

The processor 140 may control the operation state of the fourth balancing switch SW1d using the calculated duty cycle to discharge the balancing target battery cell C4 in a state where the substrate temperature is maintained at the reference temperature.

For example, if the substrate temperature is equal to the reference temperature, as shown in FIG. 4, the processor 140 may output a turn-on control signal and a turn-off control signal during the same time to the fourth balancing switch SW1d such that the power consumption of the fourth balancing resistor R4 electrically connected to the balancing target battery cell C4 is equal to the heat transfer amount transferred from the substrate PCB to the outside of the substrate PCB. For example, in the embodiment of FIG. 4, the processor 140 may alternately output the turn-on control signal and the turn-off control signal such that the duty cycle of the fourth balancing switch SW1d becomes "50%".

According to the present disclosure, if the substrate temperature is equal to the reference temperature, the duty cycle of the fourth balancing switch SW1d at which the amount of heat generated from the connected fourth balancing resistor R4 is equal to the amount of heat released from the substrate PCB to the outside may calculated to control the operating state of the fourth balancing switch SW1d, so that the balancing target battery cell C4 is discharged while the substrate temperature is maintained at the reference temperature.

Meanwhile, the processor 140 compares the substrate temperature with the reference temperature after the balancing target battery cell C4 is determined, and then if the substrate temperature is greater than the reference temperature, the processor 140 may control the operating state of the fourth balancing switch SW1d such that the power consumption of the fourth balancing resistor R4 electrically connected to the balancing target battery cell C4 is lower than the heat transfer amount transferred from the substrate PCB to the outside of the substrate PCB.

To this end, if the substrate temperature is greater than the reference temperature, the processor 140 may calculate the duty cycle of the fourth balancing switch SW1d at which the power consumption of the fourth balancing resistor R4 is lower than the heat transfer amount transferred from the substrate PCB to the outside of the substrate PCB.

In this case, the processor 140 may recalculate a duty cycle to be lower than the duty cycle of the fourth balancing switch SW1d at which the power consumption of the fourth balancing resistor R4 is equal to the heat transfer amount transferred from the substrate PCB to the outside of the substrate PCB.

For example, if the duty cycle of the fourth balancing switch SW1d at which the power consumption of the fourth balancing resistor R4 is equal to the heat transfer amount transferred from the substrate PCB to the outside of the substrate PCB is calculated as "50%", the processor 140 may recalculate a duty cycle to be lower than "50%".

Subsequently, the processor 140 may discharge the balancing target battery cell C4 while decreasing the substrate temperature greater than the reference temperature by controlling the operation state of the fourth balancing switch SW1d to the recalculated duty cycle during a preset control time.

Figure 5:
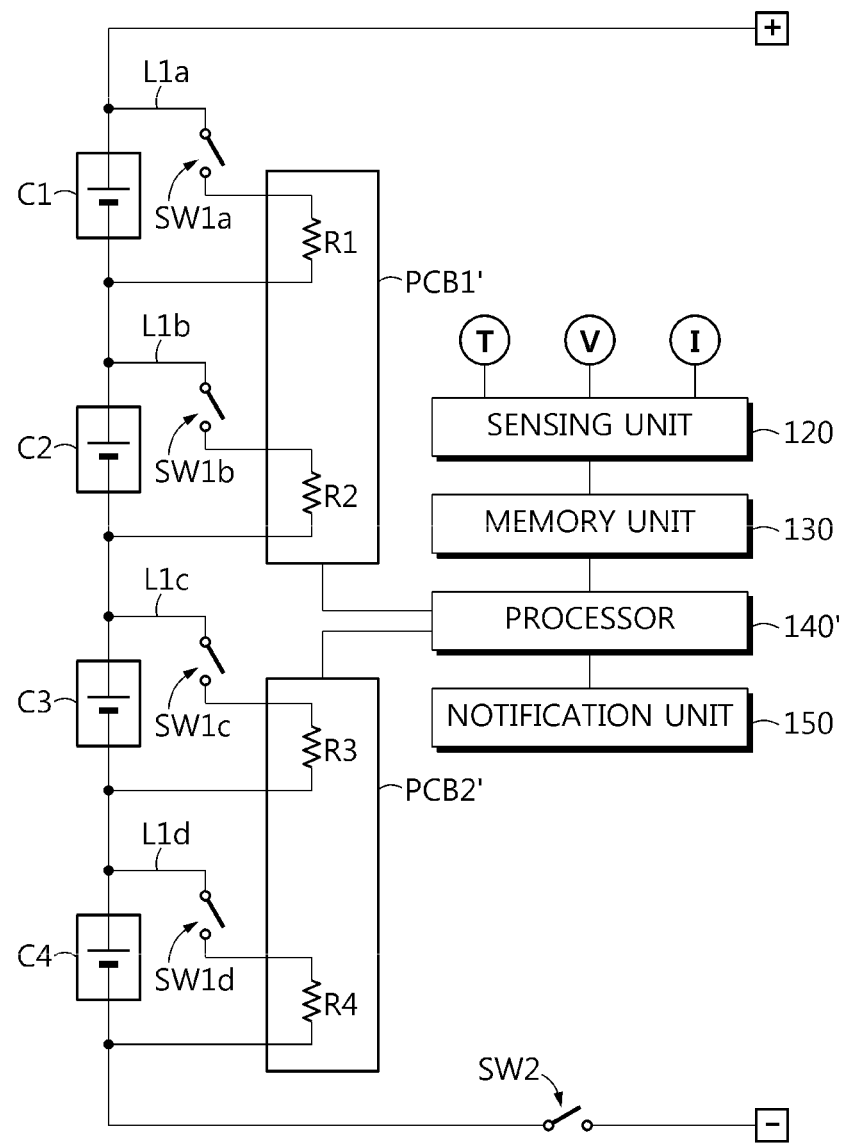
FIG. 5 is a circuit diagram schematically showing a connection configuration of a battery management device according to another embodiment of the present disclosure and a battery pack including the same.

FIG. 5 is a circuit diagram schematically showing a connection configuration of a battery management device 100 according to another embodiment of the present disclosure and a battery pack including the same.

Referring to FIG. 5, if a plurality of balancing resistors R1 to R4 are mounted to a plurality of substrates PCB1' and PCB2', a processor 140' of the battery management device 100 according to another embodiment may determine a balancing target battery cell by using identification code data at which resistor identification codes of the plurality of balancing resistors R1 to R4 are respectively mapped with substrate identification codes of the plurality of substrates PCB1' and PCB2'. Here, the identification code data may be data at which the substrate identification code of a substrate to which the balancing resistor corresponding to the resistor identification code is mounted is mapped with the resistor identification code.

For example, as shown in FIG. 5, the resistor identification codes of the balancing resistors "R1" and "R2" may be mapped to the substrate identification code of the substrate "PCB1'", and the resistor identification codes of the balancing resistors "R3" and "R4" may be mapped with the substrate identification code of the substrate "PCB2'".

After that, the processor 140' according to another embodiment may calculate an SOC difference between SOCs of the plurality of battery cells C1 to C4 and determine whether the SOC difference is greater than or equal to the preset reference difference value.

The processor 140' according to another embodiment may calculate the difference between the smallest SOC and other SOC of the plurality of battery cells C1 to C4 as a SOC difference.

If the SOCs of the plurality of battery cells "C1", "C2", "C3" and "C4" are respectively "50%", "56%", "53%" and "60%" as in the above example, the processor 140' according to another embodiment may calculate a SOC difference between the SOC "50%" of the first battery cell "C1", which is the smallest SOC, and the SOCs "56%", "53%" and "60%" of the remaining battery cells "C2", "C3" and "C4", respectively. Accordingly, the processor 140' according to another embodiment may calculate the SOC difference between the SOC of the first battery cell "C1" and the SOCs of the remaining battery cells "C2", "C3" and "C4" as "6%", "3%" and "10%", respectively.

After that, the processor 140' according to another embodiment may check whether the calculated SOC difference is greater than or equal to the preset reference difference value, and if the calculated SOC difference is greater than or equal to the preset reference difference value, the processor 140' may read the substrate identification code mapped with the identification code of the balancing resistor electrically connected to the corresponding battery cell.

In the above example, the processor 140' according to another embodiment may read substrate identification codes respectively mapped with the resistor identification codes of the second balancing resistor "R2" and the fourth balancing resistor "R4" electrically connected to the second battery cell "C2" and the fourth battery cell "C4", whose SOC differences are greater than or equal to the preset reference difference value.

The processor 140' according to another embodiment may determine a battery cell having the greatest SOC difference for each of the substrates PCB1', PCB2' corresponding to the read substrate identification codes as the balancing target battery cell C2, C4.

Accordingly, the processor 140' according to another embodiment may determine the second battery cell "C2", whose SOC difference is equal to or greater than the preset reference difference value among the first battery cell "C1" and the second battery cell "C2" electrically connected to the first balancing resistor "R1" and the second balancing resistor "R2" mounted to the substrate "PCB1'" and which has the greatest SOC, as the balancing target battery cell C2.

In addition, the processor 140' according to another embodiment may determine the fourth battery cell "C4", whose SOC difference is equal to or greater than the preset reference difference value among the third battery cell "C3" and the fourth battery cell "C4" electrically connected to the third balancing resistor "R3" and the fourth balancing resistor "R4" mounted to the substrate "PCB2" and which has the greatest SOC, as the balancing target battery cell C4.

After that, the processor 140' according to another embodiment may calculate a duty cycle in the same way as the processor 140 of the former embodiment to perform balancing while maintaining the substrate temperature of each of the substrates PCB1', PCB2' to be equal to or lower than the reference temperature.

Referring to FIGS. 1 to 4 again, the notification unit 150 may receive the determination result of the balancing target battery cell from the processor 140 and output the same to the outside. More specifically, the notification unit 150 may include at least one of a display unit for displaying the above determination result of the balancing target battery cell using at least one of a symbol, a number and a code, and a speaker device for outputting a sound.

Meanwhile, the battery pack according to the present disclosure may further include a case for accommodating the battery cells, a cartridge, a bus bar, and the like, in addition to the plurality of battery cells. In particular, the battery pack according to the present disclosure may include the battery management device to perform balancing between the SOCs of the plurality of battery cells using the balancing resistors.

The battery management device according to the present disclosure may be applied to a vehicle such as an electric vehicle or a hybrid electric vehicle. That is, the vehicle according to the present disclosure may include the battery management device according to the present disclosure.

The present disclosure described above is not limited to the above embodiments and the accompanying drawings but may be variously substituted, modified or changed by a person having ordinary knowledge in the technical field to which the present disclosure belongs, without departing from the technical scope of the present disclosure.

REFERENCE SIGNS

100: battery management device
110: balancing circuit unit
120: sensing unit
130: memory unit
140, 140': processor
150: notification unit

What is claimed is:

1. A battery management device, comprising:
    a balancing circuit unit including:
        a substrate;
        a plurality of balancing resistors mounted to the substrate, the plurality of balancing resistors being configured to be electrically connected to a plurality of battery cells, respectively;
        a plurality of balancing paths configured to electrically connect the plurality of battery cells to the plurality of balancing resistors, respectively; and
        a plurality of balancing switches for electrically connecting or disconnecting the plurality of balancing paths; and
    a processor configured to:
        determine a balancing target battery cell among the plurality of battery cells on the basis of a state of charge (SOC) of each of the plurality of battery cells,
        compare a substrate temperature of the substrate to which a balancing target resistor, among the plurality of balancing resistors, electrically connected to the balancing target battery cell is mounted with a reference temperature,
        select a balancing target switch among the plurality of balancing switches for electrically connecting or disconnecting a balancing path that electrically connects the balancing target battery cell to the balancing target resistor on the basis of the comparison result, and
        control an operation state of the selected balancing target switch to adjust a balancing current flowing through the balancing target resistor electrically connected to the balancing target battery cell, so that the substrate temperature is maintained equal to or lower than the reference temperature,
    wherein when the balancing target battery cell is determined, the processor compares the substrate temperature with the reference temperature, and when the comparison result shows that the substrate temperature is identical to the reference temperature, the processor controls the operation state of the balancing target switch such that a power consumption of the balancing target resistor electrically connected to the balancing target battery cell is equal to a heat transfer amount transferred from the substrate to the outside.

2. The battery management device according to claim 1, wherein when the balancing target battery cell is determined, the processor compares the substrate temperature with the reference temperature, and when the comparison result shows that the substrate temperature is lower than the reference temperature, the processor controls the operation state of the balancing target switch such that the balancing current is maximized.

3. The battery management device according to claim 2, wherein the processor controls the operation state of the balancing target switch such that a duty cycle of the balancing target switch is maximized.

4. The battery management device according to claim 1, wherein the processor calculates a duty cycle of the balancing target switch at which the power consumption is equal to the heat transfer amount and controls the operation state of the balancing target switch to the calculated duty cycle.

5. A battery management device, comprising:
    a balancing circuit unit including:
        a substrate;
        a plurality of balancing resistors mounted to the substrate, the plurality of balancing resistors being configured to be electrically connected to a plurality of battery cells, respectively;
        a plurality of balancing paths configured to electrically connect the plurality of battery cells to the plurality of balancing resistors, respectively; and
        a plurality of balancing switches for electrically connecting or disconnecting the plurality of balancing paths; and
    a processor configured to:
        determine a balancing target battery cell among the plurality of battery cells on the basis of a state of charge (SOC) of each of the plurality of battery cells,
        compare a substrate temperature of the substrate to which a balancing target resistor, among the plurality of balancing resistors, electrically connected to the balancing target battery cell is mounted with a reference temperature, select a balancing target switch among the plurality of balancing switches for electrically connecting or disconnecting a balancing path that electrically connects the balancing target battery cell to the balancing target resistor on the basis of the comparison result, and control an operation state of the selected balancing target switch to adjust a balancing current flowing through the balancing target resistor electrically connected to the balancing target battery cell, so that the substrate temperature is maintained equal to or lower than the reference temperature, wherein when the balancing target battery cell is determined, the processor compares the substrate temperature with the reference temperature, and when the comparison result shows that the substrate temperature is greater than the reference temperature, the processor controls the operation state of the balancing target switch such that a power consumption of the balancing target resistor electrically connected to the balancing target battery cell is lower than a heat transfer amount transferred from the substrate to the outside.

6. The battery management device according to claim 5, wherein the processor calculates a duty cycle of the balancing target switch at which the power consumption is lower than the heat transfer amount and controls the operation state of the balancing target switch to the calculated duty cycle.

7. The battery management device according to claim 5, wherein the processor calculates a duty cycle of the balancing target switch such that the substrate temperature is lower than the reference temperature within a reference time, and controls the operation state of the balancing target switch to the calculated duty cycle.

8. A battery pack, comprising the battery management device according to claim 1.

9. A vehicle, comprising the battery management device according to claim 1.

10. A battery pack, comprising the battery management device according to claim 5.

11. A vehicle, comprising the battery management device according to claim 5.

12. The battery management device according to claim 5, wherein when the balancing target battery cell is determined, the processor compares the substrate temperature with the reference temperature, and when the comparison result shows that the substrate temperature is lower than the reference temperature, the processor controls the operation state of the balancing target switch such that the balancing current is maximized.

13. The battery management device according to claim 12, wherein the processor controls the operation state of the balancing target switch such that a duty cycle of the balancing target switch is maximized.

\* \* \* \* \*